United States Patent [19]

Bertin et al.

[11] Patent Number: 4,805,142

[45] Date of Patent: Feb. 14, 1989

[54] MULTIPLE ROM DATA STATE, READ/WRITE MEMORY CELL

[75] Inventors: Claude L. Bertin, South Burlington, Vt.; Harish N. Kotecha, Manassas, Va.

[73] Assignee: International Business Machines Corporation, Armonk, N.Y.

[21] Appl. No.: 880,967

[22] Filed: Jul. 1, 1986

[51] Int. Cl.[4] .................. G11C 17/00; G11C 11/00; H03K 3/26

[52] U.S. Cl. ................................ 365/100; 365/154; 307/279

[58] Field of Search .............. 365/207, 205, 203, 154, 365/190, 181, 100, 95; 307/238.8, 239, 279

[56] References Cited

U.S. PATENT DOCUMENTS

| | | | |
|---|---|---|---|
| 3,541,531 | 11/1970 | Iwersen et al. | 340/173 |
| 3,618,052 | 11/1971 | Kwei et al. | 340/173 FF |
| 4,134,151 | 1/1979 | O'Connell et al. | 365/189 |
| 4,158,239 | 6/1979 | Bertin | 365/182 |
| 4,202,044 | 5/1980 | Beilstein et al. | 365/182 |
| 4,327,424 | 4/1982 | Wu | 365/104 |
| 4,462,088 | 7/1984 | Giuliani et al. | 365/105 |
| 4,583,201 | 4/1986 | Bertin et al. | 365/104 |

OTHER PUBLICATIONS

I. Ho et al, Latent Image can Provide Chips with Built-in Control Memories, Electronics, 8/16/81, pp. 82-85.
Fugere et al, IBM, TDB, vol. 14, #6, 11/71, Four-State Memory Cell, pp. 1695-1696.
Carlstedt et al, A Content-Addressable Memory Cell with MNOS Transistors, IEE Journal of Solid-State Circuits, vol. SC-8, No. 5, 10/73, pp. 338-343.
Ho et al, Programmable Memory Circuit, IBM TDB, vol. 17, #11, 4/75, p. 3279.

Primary Examiner—Terrell W. Fears
Assistant Examiner—Melissa J. Koval
Attorney, Agent, or Firm—David A. Mims, Jr.; Manny W. Schecter; Howard J. Walter

[57] ABSTRACT

A read/write memory cell is disclosed in which multiple ROM data states can be stored. Independent sensing of the resistance values of each of two resistors accounts for the storage of multiple ROM data states. The resistors are encompassed in a pair of cross-coupled resistive gate devices forming branch circuits, thereby allowing each branch circuit to control the conduction of current in the other branch circuit. This allows for read/write data storage in flip-flop-like fashion. In addition, since resistive gate devices are used, the ROM data may be programmed during the later stages of manufacturing.

3 Claims, 2 Drawing Sheets

MULTIPLE ROM DATA STATE, READ/WRITE MEMORY CELL

BACKGROUND OF THE INVENTION

1. Field of the Invention

This invention relates to a read/write memory cell in which multiple read only memory data states can be stored.

2. Description of the Related Art

Digital computer systems store information in read only memories (ROM) or read/write memories (R/W). These memories are built in matrix form with multiple rows and columns, the memory cells being located at the intersections of row and column lines. It is known that any of a number of electrical components may be used as a memory cell. For example, one of the earliest ROM memory cells was a resistor selectively connected to the intersections of the row and column lines. The bit status at each bit location was determined by the presence or absence of a particular resistance at the location.

Referring to the branch circuit shown in FIG. 1, the basic principle of operation of a typical ROM memory cell will be disclosed. The memory cell includes a field effect transistor (FET) 10. Data is permanently stored in the memory cell by the selection of particular impedance characteristics of FET 10. For example, the threshold voltage of FET 10 may be determined by ion implantation during the manufacturing process. The drain of FET 10 is connected to a drain potential $V_{DD}$. The gate of FET 10 is connected to $V_{in}$, which determines if FET 10 is on or off. The source of FET 10 is connected to $V_{out}$. When FET 10 is on, $V_{out}$ will be $V_{DD}$ minus the threshold voltage of FET 10. The threshold voltage of FET 10 can then be determined by sensing $V_{out}$.

If the circuit of FIG. 1 is repeated in array fashion, a ROM memory is formed wherein each of the FET devices functions as a memory cell. The FET gates are connected to word lines and the sources are connected to bit lines. A particular memory cell is read by raising the appropriate word line potential to switch on the FET and sensing the voltage on the appropriate bit line.

R/W memory cells capable of also operating as ROM memory cells are also known. These memory cells include a pair of the branch circuits shown in FIG. 1. The transistors are cross-coupled to act as a flip-flop. At power-up of the device a built in bias, caused by the different DC impedance of each transistor, pulls the flip-flop into a particular data state. The ROM mode of operation is based on sensing the output voltage of either branch circuit immediately following power up, as previously described. Because of the flip-flop structure, the impedances of the two branch circuits are interdependent. If one branch circuit impedance is high, the other must be low, and vice-versa. Only two ROM bits or data states, 0 or 1, are possible depending upon the relative magnitudes of impedance. Thus, only one ROM data state is capable of being stored. The R/W mode of operation is based on controlling the state of the flip-flop after power-up. These R/W memory cells are therefore capable of storing only one ROM data bit and one R/W data bit simultaneously.

As the memory requirements for digital computer systems become more demanding, the storage density of these systems must increase to keep the system from growing prohibitively large and costly. Increasing the ROM data storage capability of previously single bit R/W, single bit ROM memory cells would be one such way of increasing storage density. A R/W memory which is capable of storing multiple ROM data states has heretofore not been recognized.

Personalization is the programming of fixed data into ROM memory cells. Depending on the manufacturing process involved, personalization may occur during the early or late stages of device fabrication. It is advantageous to delay memory personalization until the latter stages of the manufacturing process to allow for late changes in the fixed program to be incorporated into the memory. The ability to personalize a memory cell late in the manufacturing process is known as "late programming capability."

In view of the foregoing, it is desirable to create a R/W memory cell which can store multiple ROM data states. It would also be desirable that such a memory cell have late programming capability.

SUMMARY OF THE INVENTION

It is the principal object of this invention to improve memory cells.

Another object of this invention is to store multiple ROM data states in a single R/W memory cell.

Still another object of this invention is to provide the aforementioned memory cell with late programming capability.

These and other objects of this invention are accomplished by sensing each of two independent resistances of the branch circuits of a R/W memory cell. The resistances of two resistors in the branch circuits, unlike the impedances sensed in previous branch circuits, are not interdependent. Therefore, the resistance value of each branch circuit corresponds to individual binary ROM data states.

The R/W memory cell of the invention includes a pair of branch circuits each exhibiting a predetermined resistance characteristic when in a conductive state. As stated, each resistance value corresponds to a different ROM data bit status. A pair of cross-coupled resistive gate devices form the branch circuits, thereby allowing each branch circuit to control the conduction of current in the other branch circuit. This allows for R/W storage in flip-flop-like fashion. One end of the resistive gate of each of the devices is serially connected to the drain of the other device. Sensing of the resistance characteristic of each branch circuit can be achieved by connecting the other end of the resistive gate of each of the devices to a common word line, and further connecting the source of each of the devices to different bit lines.

DESCRIPTION OF THE PREFERRED EMBODIMENT

Figure 2:
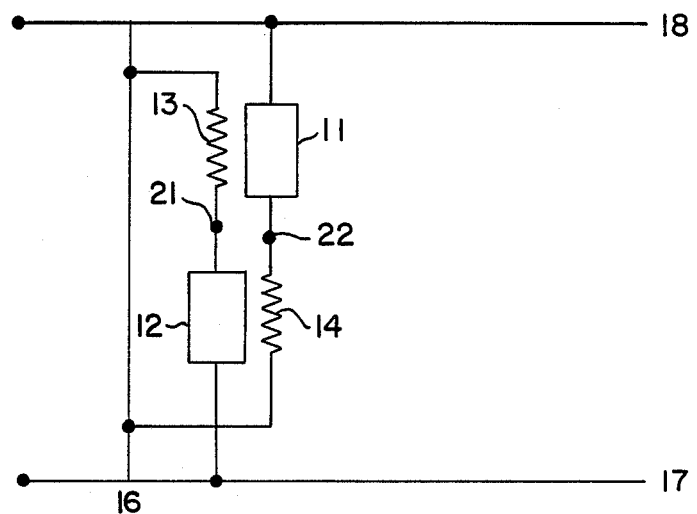
FIG. 2 is a circuit schematic of a R/W memory cell according to the invention, including the connecting word lines and bit lines.

The R/W memory cell of the invention is shown in FIG. 2. The memory cell includes a pair of cross-coupled resistive gate devices 11 and 12, a known type of FET. Resistive gates 13 and 14 are part of the FET devices themselves, removing the need for additional resistive components. This assures small memory cell size. It is also known that resistive gate device fabrication allows for determining the gate resistance during the late stages of fabrication. The gate resistance is programmed by selective ion implantation of the gate electrode. Thus, because of the late programming capability of resistive gate devices, personalization of the ROM data may be delayed during manufacturing to allow for late changes in the fixed program to be incorporated into the memory.

The invention will be disclosed in a series of steps. First, referring to FIG. 2, operation of the R/W memory cell in ROM mode will be described. Next, with reference to FIG. 3, operation of the memory cell in R/W mode will be described. Finally, an alternative embodiment of the invention will be disclosed with reference to FIG. 4.

ROM Mode Operation

Figure 1:
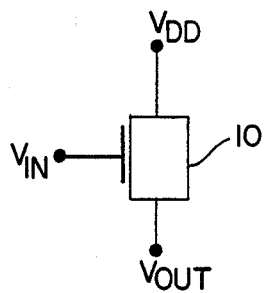
FIG. 1 is a circuit schematic of a ROM memory cell.

Referring to FIG. 2, resistive gate device 12 and resistive gate 13 form a branch circuit similar in operation to that described with respect to FIG. 1. The variable impedance FET is replaced with a variable resistor and a low resistance FET. Terminal $V_{in}$ is now at resistive gate 14. The source of resistive gate device 12 is connected to bit line 17. Resistive gate device 11 and resistive gate 14 operate similarly except that terminal $V_{in}$ is now at resistive gate 13 and the source of resistive gate device 11 is connected to bit line 18. Word line 16 operates as a common cell access node to both resistive gates 13 and 14.

Two ROM data bits are stored in the R/W memory cell simply by setting the resistance of resistive gates 13 and 14. The two resistances are not interdependent and can therefore be sensed independent of each other as long as the voltage differential between word line 16 and voltage nodes 21 and 22 exceeds the threshold voltage of transistors 11 and 12 respectively. Initially, word line 16 is grounded and bit lines 17 and 18 are precharged to a high voltage level (hereinafter referred to simply as "high") to prevent conduction through resistive gate devices 11 and 12. The data bits are determined by sensing the resistance of resistive gates 13 and 14. To sense the resistance of resistive gate 13, the voltage level of word line 16 is raised high and bit line 17 is placed near ground so that resistive gate device 12 conducts. When resistive gate device 12 is on, the current in bit line 17 is a function of the resistance of resistive gate 13. Therefore, the data bit status may be determined by measuring the current in bit line 17. The resistance of resistive gate 14 is sensed similarly with respect to the operation of word line 16 and bit line 18, and may be done simultaneously with the sensing of resistive gate 13.

In ROM mode, the R/W memory cell can store two data bits simultaneously to create four possible data state combinations (0,0), (0,1), (1,0), and (1,1). The memory cell can be extended to store up to $N_2$ data state combinations by providing N possible resistance values for each resistive gate, providing that N-level sensing can be accomplished.

R/W Mode of Operation

Figure 3:
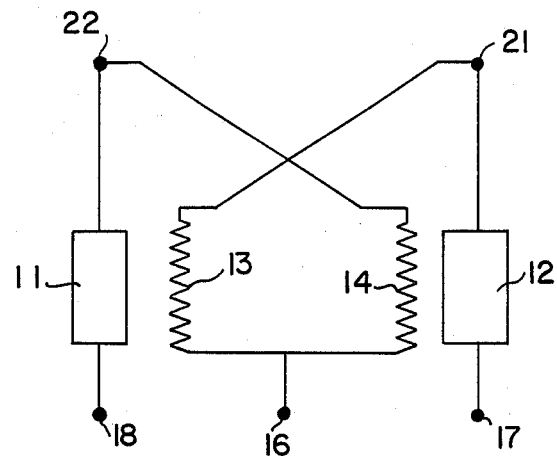
FIG. 3 is a rearranged circuit schematic of the same R/W memory cell as shown in FIG. 2.

The memory cell shown in FIG. 2 can also be operated as a R/W memory. FIG. 3 shows the same memory cell as FIG. 2 redrawn to simplify explanation of the R/W memory cell operation. The cross-coupled device flip-flop can be built with a bias that pulls it into the same state with every power restoration. The bias is determined by the DC impedance characteristics of the transistors and resistors. This data state can be altered to operate the memory cell as a R/W memory.

In the R/W memory cell mode, cross-coupled resistive gate devices 11 and 12 are operated as a flip-flop or static latch. Cross-coupling resistive gate devices 11 and 12 allows each branch circuit to control the conduction of current in he other branch circuit. Word line 16 is normally maintained at a high voltage standby level. Bit lines 17 and 18 are normally grounded to maintain a steady state of the memory cell. Data is stored as high or low voltage levels at nodes 21 and 22.

Initially, the R/W memory cell is cleared by grounding word line 16 to discharge nodes 21 and 22. When word line 16 is returned to the standby voltage level, the data state of the latch will depend on the resistance value of resistive gates 13 and 14. If resistive gate 13 is of greater resistance than resistive gate 14, the latch will operate in a known manner to set node 21 high, resistive gate device 11 being on. Node 22 will be discharged and resistive gate device 12 will be off. If resistive gate 13 is of lesser resistance than resistive gate 14, the latch will set in the reverse state. If resistive gates 13 and 14 are of the same resistance, the latch will set in an indeterminate manner.

Regardless of the data state of the latch after clearance, data must then be written into the latch to set or reset it in the data state desired. For example, to reset node 22 high and node 21 discharged, bit line 18 is raised high. This ensures that node 22 is high and resistive gate device 12 is on. Since bit line 17 is grounded, node 21 will be discharged, thereby turning resistive gate device 11 off. Thus, node 21 is discharged and node 22 remains high. To maintain the data state of the latch by returning to the steady state previously mentioned, bit line 18 is once again grounded. Similarly, to reset node 21 high and node 22 discharged, bit line 17 is raised high. Subsequently discharging bit line 17 maintains the data state of the latch.

To read the data stored in the R/W memory, one need only discharge word line 16, thereby ensuring that resistive gate devices 11 and 12 are off. The data state of the latch is then determined by sensing to compare the current on bit lines 17 and 18. After reading the R/W data, the latch must be refreshed to reset it to the proper R/W data state. In addition, data stored in the R/W memory may be read non-destructively. Non-destructive reading is accomplished by temporarily raising the voltage level of word line 16 above the normal standby level. Again, the data state of the latch is determined by sensing to compare the current on bit lines 17 and 18.

The R/W memory cell can be used to store data as both a ROM and a R/W memory simultaneously. Multiple data bits can be stored in ROM mode, as previously described, together with a single data bit in R/W mode. However, data cannot be read simultaneously in both modes since word line 16 must be high to sense ROM data and low to sense R/W data. In addition, after ROM data is read the latch must be refreshed to its intended R/W data state. The R/W memory cell can also be used as a single bit ROM, as mentioned in the description of the related art, if such application is desired.

Alternative Embodiment of the Invention

Figure 4:
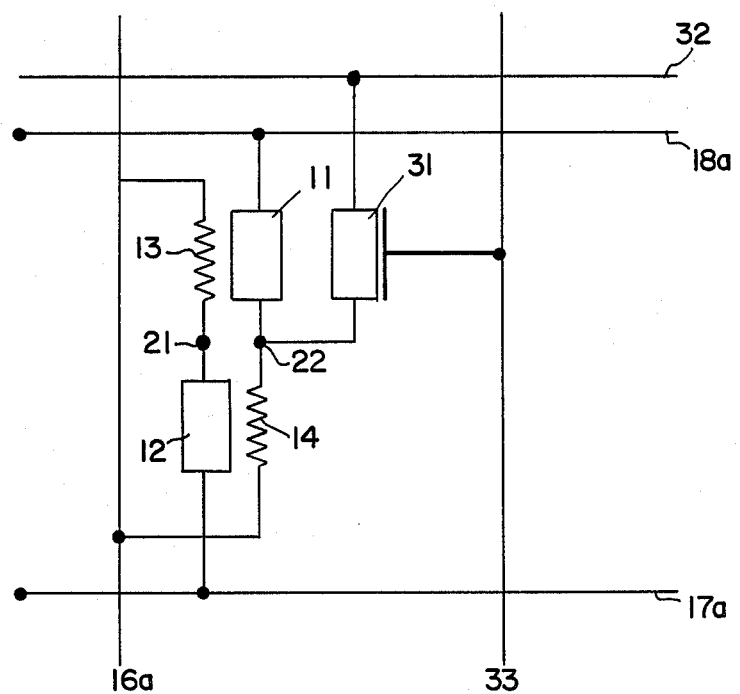
FIG. 4 is a circuit schematic of an alternative embodiment of the R/W memory cell of FIG. 2.

FIG. 4 shows an alternative embodiment of the memory cell of the invention. The ROM mode of operation for the circuit of FIG. 4 is identical to that for the circuit of FIG. 2. The R/W mode of operation for the circuit of FIG. 4 is different than that for FIG. 2 and is similar to that for a conventional 6-device static cell except that one of the pair of I/O devices is missing. Elements of the memory cell retained from FIGS. 2 and 3 continue to be designated by the same numeral.

FET 31 is used as an I/O device to write data into the memory cell. Word line 33 is used to control the state of FET 31 to input data from third bit line 32. Pulsing word line 33 high allows for direct setting of node 22. Since the voltage level of node 22 also determines whether resistive gate device 12 is conducting, node 21 is also set. ROM mode bit lines 17a and 18a are maintained at ground in R/W mode. Select line 16a is maintained high in R/W mode. Data is read in the same manner as that described for the R/W memory cell of FIGS. 2 and 3.

R/W mode operation of the memory cell of FIG. 4 may be faster than that of FIGS. 2 and 3 because of the direct setting of data states. However, the extra device tends to require more circuit space, thereby reducing the overall storage density. Thus, which circuit one chooses to use may best be determined by the specific application.

While the invention has been described with respect to a preferred and alternative embodiment thereof, it will be understood by those skilled in the art that various changes in detail may be made therein without departing from the spirit, scope, and teaching of the invention. For example, any impedance characteristic of a predetermined electrical parameter may be used in the memory cells in place of resistance with the appropriate modification. Also, resistive gate devices need not be used to accomplish the storage of multiple ROM data states. Instead, distinct transistors and resistors may be used. Accordingly, the memory cells herein disclosed are to be limited only as specified in the following claims.

What is claimed is:

1. A memory cell for storing a plurality of independent data states, each memory cell comprising:

first and second branch circuits, each of said branch circuits having a resistive gate device and a resistive gate, one end of said resistive gate in each of said branch circuits coupled to a common cell access node, each of said branch circuits exhibiting an impedance characteristic of a predetermined electrical parameter within said branch circuit as a function of said resistive gate when said branch circuit is in its conductive state, the impedance characteristic of said first branch circuit being independent of the impedance characteristic of said second branch circuit, each value of the impedance characteristic corresponding to a different data state;

means within each branch circuit for controlling the conduction of current in the other branch circuit; and means for sensing the impedance characteristic of each of said branch circuits to produce said different data states.

2. The memory cell of claim 1 wherein said first and second branch circuits comprise a pair of interconnected resistive gate devices, one end of the resistive gate of each of said devices serially connected to the drain of the other of said devices, the other end of the resistive gate of each of said devices connected to a common word line, the sources of said devices each connected to a different bit line.

3. The memory cell of claim 2 further comprising a separately gated device coupling the capacitance of one of the internal nodes of said memory cell to a third bit line.

* * * * *